(12) United States Patent
Nishimura et al.

(10) Patent No.: US 8,993,352 B2
(45) Date of Patent: Mar. 31, 2015

(54) PLASMA PROCESSING METHOD AND PLASMA PROCESSING APPARATUS

(71) Applicant: Tokyo Electron Limited, Tokyo (JP)

(72) Inventors: Eiichi Nishimura, Miyagi (JP); Tadashi Kotsugi, Beaverton, OR (US); Takashi Sone, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/080,214

(22) Filed: Nov. 14, 2013

(65) Prior Publication Data

US 2014/0141532 A1    May 22, 2014

Related U.S. Application Data

(60) Provisional application No. 61/730,575, filed on Nov. 28, 2012.

(30) Foreign Application Priority Data

Nov. 16, 2012   (JP) ................................. 2012-252385

(51) Int. Cl.
*H01L 43/12* (2006.01)
*H01J 37/32* (2006.01)

(52) U.S. Cl.
CPC ........... *H01L 43/12* (2013.01); *H01J 37/32449* (2013.01); *H01J 37/32724* (2013.01)

USPC .............. 438/3; 438/689; 438/706; 438/710; 156/345.29

(58) Field of Classification Search
None
See application file for complete search history.

(56) References Cited

U.S. PATENT DOCUMENTS

| 2004/0137749 A1 | 7/2004 | Ying | |
| 2010/0103564 A1* | 4/2010 | Nishioka et al. | 360/319 |
| 2013/0252348 A1* | 9/2013 | Hsieh et al. | 438/3 |
| 2013/0264665 A1* | 10/2013 | Jan et al. | 257/421 |

* cited by examiner

*Primary Examiner* — Angel Roman
(74) *Attorney, Agent, or Firm* — Pearne & Gordon LLP

(57) ABSTRACT

A plasma processing method is used to etch a multilayered material having a stacked structure, in which a first magnetic layer, an insulating layer, a second magnetic layer, and a mask material are stacked in sequence, in a plasma processing apparatus including a processing chamber that partitions a processing space where plasma is generated and a gas supply unit that supplies a processing gas into the processing space. The plasma processing method includes a mask forming process of forming a mask on the second magnetic layer by etching the mask material; an etching process of supplying the processing gas into the processing chamber to generate plasma, etching the second magnetic layer by the mask, and stopping the etching on a surface of the insulating layer. Further, the second magnetic layer contains CoFeB, the insulating layer contains MgO, and the processing gas contains $H_2$ and F or a fluorine compound.

17 Claims, 19 Drawing Sheets

*FIG. 14*

PROCESSING OPTION :ALL ELEMENTS ANALYSED(NORMALISED)

| SPECTRUM | IN STATS. | O | Si | S | Fe | Co | Ta | Pt |
|---|---|---|---|---|---|---|---|---|
| 1 | YES | 72.4 | | | | | 27.6 | |
| 2 | YES | | | | | | 100.0 | |
| 3 | YES | | | | | | | 100.0 |
| 4 | YES | 52.8 | | 2.6 | 8.2 | 18.2 | 11.5 | 6.6 |
| 5 | YES | 20.9 | 6.9 | 10.4 | 9.9 | 50.4 | | 1.6 |
| | | | | | | | | |
| MAX. | | 72.4 | 6.9 | 10.4 | 9.9 | 50.4 | 100.0 | 100.0 |
| MIN. | | 20.9 | 6.9 | 2.6 | 8.2 | 18.2 | 11.5 | 1.6 |

ALL RESULTS IN ATOMIC%

PLASMA PROCESSING METHOD AND PLASMA PROCESSING APPARATUS

CROSS-REFERENCE TO RELATED APPLICATION

This application claims the benefit of Japanese Patent Application No. 2012-252385 filed on Nov. 16, 2012, and U.S. Provisional Application Ser. No. 61/730,575 filed on Nov. 28, 2012, the entire disclosures of which are incorporated herein by reference.

TECHNICAL FIELD

The embodiment described herein pertains generally to a plasma processing method and a plasma processing apparatus.

BACKGROUND

Patent Document 1 describes a plasma processing method. In this plasma processing method, a MRAM device is manufactured by processing a multilayered object including a magnetic tunnel junction (MTJ) in which an insulating layer is interposed between a lower magnetic layer and an upper magnetic layer. Herein, as a material of the insulating layer, $Al_2O_3$ is used. The lower magnetic layer has a fixed magnetization direction, and a magnetization direction of the upper magnetic layer is changed by an external magnetic field. To be specific, according to the method described in Patent Document 1, the MRAM device is manufactured by (a) forming a first mask on an upper electrode layer, (b) plasma-etching the upper electrode layer, the upper magnetic layer, and the insulating layer, (c) removing the first mask, (d) forming a second mask on the upper electrode layer, and (e) etching a lower electrode layer.

Patent Document 1: Specification of U.S. Patent Laid-open Publication No. 2004/0137749

In an apparatus described in Patent Document 1, when the multilayered object is etched, a residue containing a conductive material may be deposited on a side wall of the insulating layer. If the residue is deposited on the side wall of the insulating layer, a leak current may be generated at the MTJ and characteristics of the MRAM device may be deteriorated. In order to solve such a problem, it is considered that the etching process is stopped for the moment on a top surface of the insulating layer to suppress the residue from being deposited on the side wall of the insulating layer. In this case, it is necessary to increase etching selectivity between the magnetic layer and the insulating layer.

Meanwhile, it is known that if MgO is employed as a material of the insulating layer of the MTJ device, a high MR ratio can be achieved. However, since MgO is a new material for the insulating layer of the MTJ device, there have not been known etching conditions in which high selectivity between a magnetic layer and an insulating layer made of MgO can be obtained.

Further, in order to etch a magnetic layer, a metal mask needs to be formed on the magnetic layer by the etching process or the like. However, when the metal mask is formed on the magnetic layer, a top surface (surface) of the magnetic layer may be modified and a modified layer different from the magnetic layer may be formed. There have not been known conditions for etching a magnetic layer including this modified layer.

For this reason, in the corresponding technical field, there have been required a plasma processing method and a plasma processing apparatus in which an etching of a magnetic layer can be stopped for the moment on a top surface of an insulating layer made of MgO to suppress a leak current from occurring and to improve characteristics of a MRAM device.

SUMMARY

In one example embodiment, a plasma processing method is used to etch a multilayered material that has a stacked structure, in which a first magnetic layer, an insulating layer, a second magnetic layer, and a mask material are stacked in sequence, in a plasma processing apparatus including a processing chamber that partitions a processing space where plasma is generated and a gas supply unit that supplies a processing gas into the processing space. The plasma processing method includes a mask forming process of forming a mask on the second magnetic layer by etching the mask material; an etching process of supplying the processing gas into the processing chamber to generate plasma, etching the second magnetic layer by using the mask, and stopping the etching on a surface of the insulating layer. Further, the second magnetic layer contains CoFeB, the insulating layer contains MgO, and the processing gas contains $H_2$ and F or a fluorine compound.

According to the plasma processing method, the second magnetic layer is etched with the processing gas containing F or a fluorine compound. Since a F radical reacts with CoFeB contained in the second magnetic layer but does not react with MgO contained in the insulating layer, etching selectivity between the second magnetic layer containing CoFeB and the insulating layer containing MgO can be improved. Further, fluorine tends to generate fewer residues than other halogen elements. For this reason, while improving verticality of the second magnetic layer, it is possible to avoid dispersion and deposition of a residue onto a side wall of the insulating layer during the etching process of the insulating layer to be described later. Furthermore, a surface of the second magnetic layer containing CoFeB is easily modified, and in some cases, after performing a mask process, a modified layer may be formed on the surface of the second magnetic layer depending on processing conditions. Since the processing gas contains F, even if the modified layer is formed, the second magnetic layer can be easily etched. Moreover, according to the plasma processing method, a residue deposited on a side surface of the second magnetic layer and a top surface of the insulating layer is removed by the processing gas containing $H_2$. Therefore, while improving verticality of the second magnetic layer, it is possible to further avoid dispersion and deposition of a residue onto the side wall of the insulating layer during the etching process of the insulating layer to be described later. Therefore, according to the plasma processing method in accordance with the example embodiment, the etching of a magnetic layer can be stopped for the moment on a top surface of an insulating layer made of MgO to suppress generation of a leak current. Thus, characteristics of a MRAM device can be improved.

In the etching process, the second magnetic layer including a modified layer formed on a surface thereof may be etched. Even if the modified layer is formed on the surface of the second magnetic layer, since the processing gas contains F, the second magnetic layer can be easily etched.

The modified layer may contain a metal element contained in the mask material. Further, the metal element may include Ta. Even if the modified layer is made of a material which contains a metal element and is difficult to be etched, since the processing gas contains F, the second magnetic layer can be easily etched.

The etching process may include a first etching process of supplying a first processing gas into the processing chamber to generate plasma, and etching the surface of the second magnetic layer including the modified layer; a second etching process of supplying a second processing gas into the processing chamber to generate plasma, etching the second magnetic layer, and stopping the etching on the surface of the insulating layer; and a third etching process of supplying a third processing gas into the processing chamber to generate plasma, and removing a residue generated in the second etching process. The first processing gas may contain F or a fluorine compound, the second processing gas may contain a gas having a halogen element, and the third processing gas may contain $H_2$. Thus, the etching process can be divided into three sub-processes.

The first processing gas and the second processing gas may be supplied into the processing chamber at the same time, and the first etching process and the second etching process may be carried out at the same time. Further, the second processing gas and the third processing gas may be supplied into the processing chamber at the same time, and the second etching process and the third etching process may be carried out at the same time. With this configuration, it is possible to reduce an etching process time.

The third processing gas may further contain at least one of $N_2$, Ar, and He gases. In this case, a residue deposited on a side surface of the second magnetic layer and the top surface of the insulating layer can be further removed.

The first processing gas and the second processing gas may contain the same elements. With this configuration, the gas supply unit can be simplified.

The plasma processing method may further include a coating process of coating a surface of the multilayered material with an insulating film after the etching process. In this case, in a post-process, it is possible to further suppress deposition of a residue on the side wall of the insulating layer.

The plasma processing method may further include a fourth etching process of supplying a fourth processing gas into the processing chamber to generate plasma, and etching the insulating layer and the first magnetic layer after the coating process. Further, the first magnetic layer may contain CoFeB, and the fourth processing gas may contain $CH_4$. In this case, a MRAM device can be manufactured from the multilayered material.

The plasma processing apparatus may further include a first electrode provided in the processing chamber, a second electrode provided to face the first electrode, a first power supply unit configured to apply a power having a first frequency to the first electrode, and a second power supply unit configured to apply a power having a second frequency to the second electrode. Further, the second power supply unit may apply a power having a frequency of about 1 MHz or less as the second frequency to the second electrode to generate plasma in the processing chamber. In this case, since the power having a relatively low frequency is applied to the second electrode, plasma is generated at a position apart from a target object. Thus, an ion can be vertically attracted by the second electrode, and verticality of a side wall of the target object can be improved accordingly.

The second power supply unit may apply a power having a frequency of about 400 kHz or less as the second frequency to the second electrode to generate plasma in the processing chamber. In this case, since the power having a relatively low frequency of about 400 kHz is applied to the second electrode, plasma is generated at a position apart from the target object. Thus, verticality of a side wall of the multilayered material to be etched can be improved.

The first power supply unit may apply a power of about 100 W to about 300 W to the first electrode to generate plasma in the processing chamber. In this case, since the relatively low power is applied to the first electrode, low-density plasma is generated at a lower limit of the margin of the plasma ignition, and for example, the etched insulating layer or first magnetic layer can be exhausted to the outside in the form of an organic metal complex having a large molecular structure.

The plasma processing apparatus may further include an exhaust unit configured to depressurize the processing space to a predetermined pressure level and a control unit configured to control the exhaust unit. Further, the control unit may control the exhaust unit to allow a pressure in the processing space to be about 10 mTorr to about 30 mTorr. In this case, by setting the pressure in the processing space S to be low, a density of plasma generated in the processing space can be reduced, and by lengthening an ion mean free path, verticality of etching profile can be improved.

The processing space may have a gap of about 20 mm to about 30 mm. With this configuration, a sputtering effect can be increased and exhaust can be promoted due to a low residence time (short staying time).

In another example embodiment, a plasma processing apparatus can etch a multilayered material having a stacked structure in which a first magnetic layer, an insulating layer, a second magnetic layer, and a mask material are stacked in sequence. The plasma processing apparatus includes a processing chamber configured to partition a processing space where plasma is generated; a gas supply unit configured to supply a processing gas into the processing space; and a control unit configured to control the gas supply unit. Further, the control unit controls the gas supply unit such that a mask is formed on the second magnetic layer by etching the mask material, and such that the processing gas is supplied into the processing chamber to generate plasma, the second magnetic layer is etched by using the mask, and the etching is stopped on a surface of the insulating layer. Furthermore, the second magnetic layer contains CoFeB, the insulating layer contains MgO, and the processing gas contains $H_2$ and F or a fluorine compound.

According to the plasma processing apparatus in accordance with the another example embodiment, the same effects as those of the above-described plasma processing method can be obtained.

The example embodiments provide a plasma processing method and a plasma processing apparatus which can improve characteristics of a MRAM device by suppressing a leak current from generating.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 14 shows EDX measurement results at points depicted in FIG. 13;

DETAILED DESCRIPTION

Figure 1:
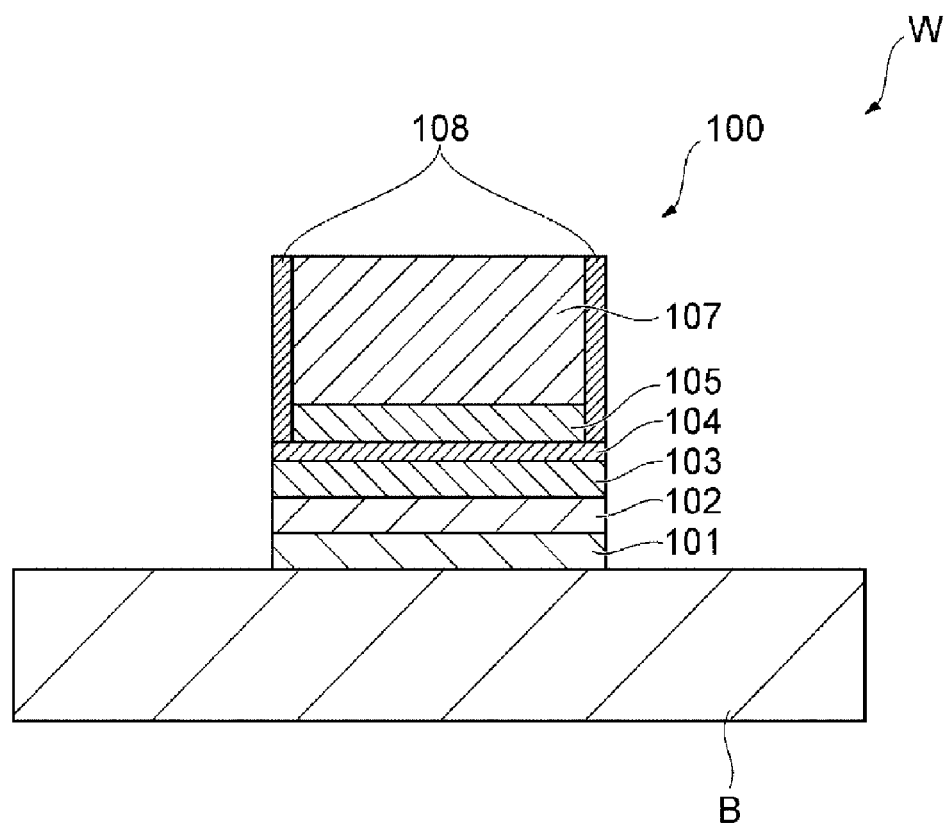
FIG. 1 is a diagram of a MRAM device example manufactured by a plasma processing method in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 shows an example of a MRAM device 100 manufactured by an etching method in accordance with an example embodiment. The MRAM device 100 shown in FIG. 1 is provided on a substrate B and includes a lower electrode layer 101, a pinning layer 102, a first magnetic layer 103, an insulating layer 104, a second magnetic layer 105, and an etching mask 107 stacked in sequence from the bottom. Further, an insulating film 108 is formed at side walls of the second magnetic layer 105 and the etching mask 107 of the MRAM device 100.

The lower electrode layer 101 is formed on the substrate B as an electrode member having electrical conductivity. A thickness of the lower electrode layer 101 is, for example, about 5 nm. The pinning layer 102 is provided between the lower electrode layer 101 and the first magnetic layer 103. The pinning layer 102 is configured to fix or pin a magnetization direction of the first magnetic layer 103 by a pinning effect by an anti-ferromagnetic material. The pinning layer 102 is made of an anti-ferromagnetic material such as IrMn (iridium manganese), PtMn (platinum manganese), and the like and has a thickness of, for example, about 7 nm.

The first magnetic layer 103 is a ferromagnetic material-containing layer formed on the pinning layer 102. The first magnetic layer 103 functions as a so-called "pinned layer" in which a magnetization direction is maintained uniformly without the influence of an external magnetic field by the pinning effect of the pinning layer 102. The first magnetic layer 103 is made of CoFeB and has a thickness of, for example, about 2.5 nm.

The insulating layer 104 is interposed between the first magnetic layer 103 and the second magnetic layer 105. Since the insulating layer 104 is interposed between the first magnetic layer 103 and the second magnetic layer 105, a tunnel magneto resistance is generated between the first magnetic layer 103 and the second magnetic layer 105. That is, between the first magnetic layer 103 and the second magnetic layer 105, an electric resistance is caused by a relative relationship (parallel or anti-parallel relationship) between a magnetization direction of the first magnetic layer 103 and a magnetization direction of the second magnetic layer 105. The insulating layer 104 is made of MgO and has a thickness of, for example, about 1.3 nm.

The second magnetic layer 105 is a ferromagnetic material-containing layer formed on the insulating layer 104. The second magnetic layer 105 functions as a so-called "free layer" in which a magnetization direction can be changed in response to an external magnetic field as magnetic information. The second magnetic layer 105 is made of CoFeB and has a thickness of, for example, about 2.5 nm.

The etching mask 107 is formed on the second magnetic layer 105. The etching mask 107 is formed in a shape along a planar shape of the MRAM device 100. The etching mask 107 is made of, for example, Ta (tantalum), TiN (titanium nitride), and the like and has a thickness of, for example, about 50 nm. Further, an upper electrode layer may be formed between the second magnetic layer 105 and the etching mask 107. The upper electrode layer is formed on the second magnetic layer 105 as an electrode member having electrical conductivity. A thickness of the upper electrode layer is, for example, about 5 nm.

Figure 2:
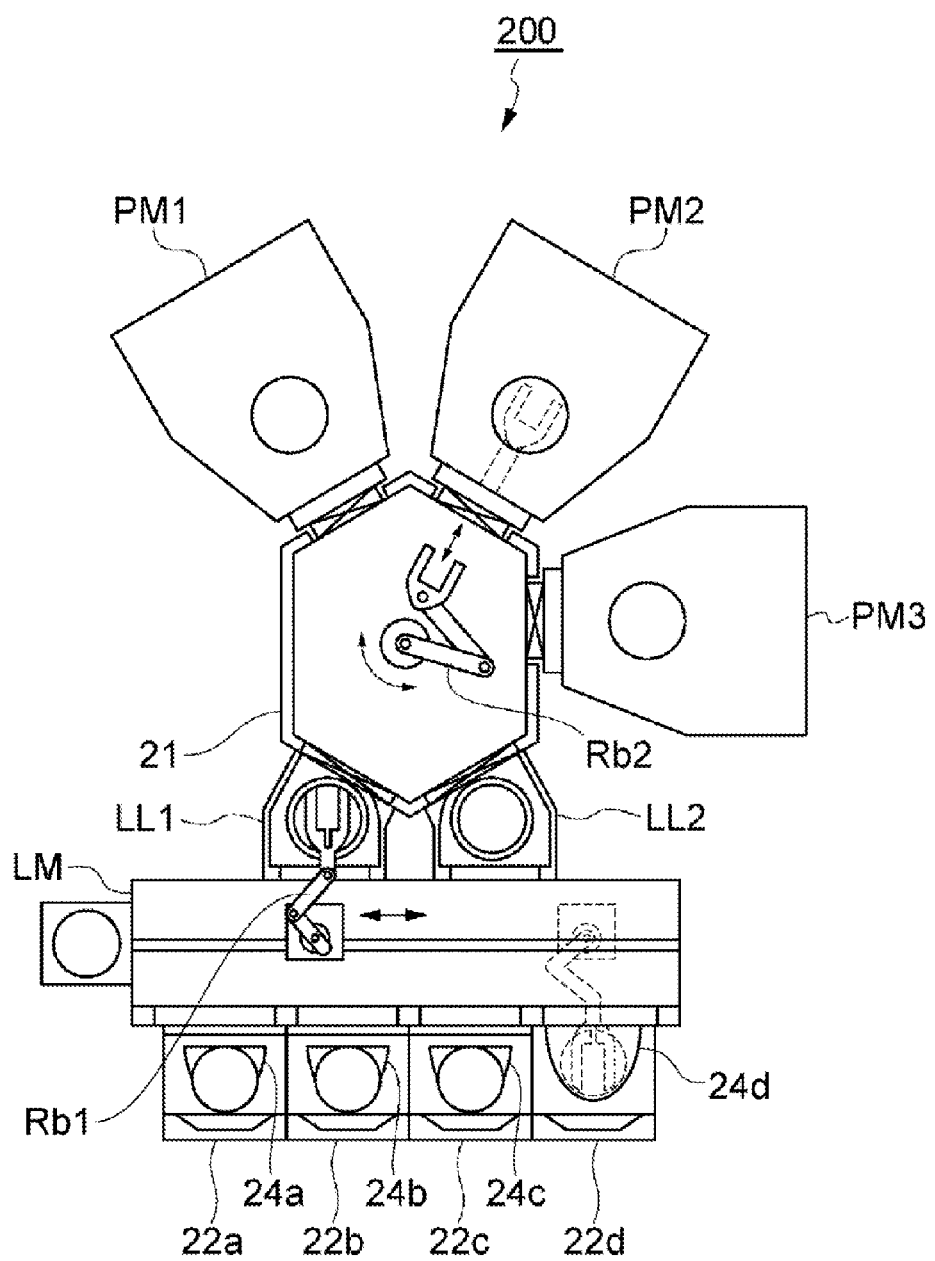
FIG. 2 is a schematic diagram of a substrate processing system including a plasma processing apparatus in accordance with the example embodiment.

Hereinafter, a manufacturing system of the MRAM device 100 will be explained. The MRAM device 100 is manufactured by using, for example, a substrate processing system as depicted in FIG. 2. FIG. 2 is a plane view schematically illustrating a substrate processing system in accordance with the example embodiment. A substrate processing system 200 depicted in FIG. 2 includes substrate mounting tables 22a to 22d, accommodation containers 24a to 24d, a loader module LM, load lock chambers LL1 and LL2, process modules PM1, PM2, and PM3, and a transfer chamber 21.

The substrate mounting tables 22a to 22d are arranged along one periphery of the loader module LM. On the substrate mounting tables 22a to 22d, the accommodation containers 24a to 24d are mounted respectively. Within the accommodation containers 24a to 24d, target objects W are accommodated.

Within the loader module LM, a transfer robot Rb1 is provided. The transfer robot Rb1 takes out a target object W accommodated in any one of the accommodation containers 24a to 24d and transfers the target object W to the load lock chamber LL1 or LL2.

The load lock chambers LL1 and LL2 are arranged along the other periphery of the loader module LM and serve as preliminary depressurized chambers. The load lock chambers LL1 and LL2 are connected to the transfer chamber 21 via respective gate valves.

The transfer chamber 21 is a depressurizable chamber, and a transfer robot Rb2 is provided within the transfer chamber 21. The transfer chamber 21 is connected to the process modules PM1 to PM3 via respective gate valves. The transfer robot Rb2 takes out the target object W from the load lock chamber LL1 or LL2, and then, transfers it to the process modules PM1, PM2, and PM3 in sequence. The process modules PM1, PM2, and PM3 of the substrate processing system 200 may be a substrate processing apparatus (substrate processing apparatus configured to remove reaction product), a film forming apparatus, and a plasma etching apparatus, respectively. The film forming apparatus may use the CVD (Chemical Vapor Deposition) method. Hereinafter, considering ease in explaining and understanding, there will be explained a substrate processing system in which a substrate processing apparatus configured to remove the reaction product is employed as the process module PM1, a film forming apparatus is employed as the process module PM2, and a plasma etching apparatus is employed as the process module PM3.

Figure 3:
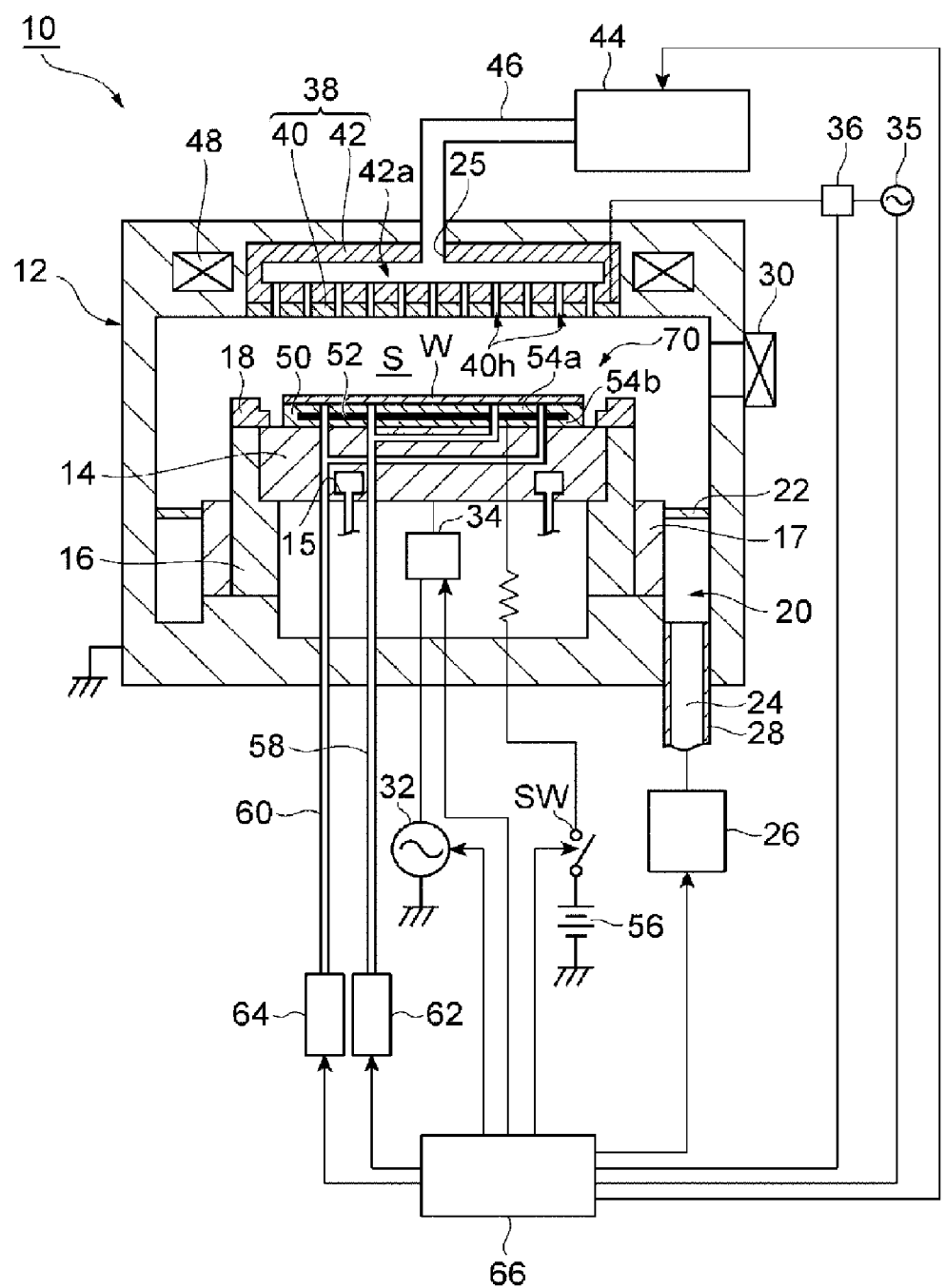
FIG. 3 is a cross sectional view of the plasma processing apparatus in accordance with the example embodiment.

Hereinafter, details of a plasma etching apparatus serving as a plasma processing apparatus employed as the process module PM3 will be explained. FIG. 3 shows a cross sectional view of a plasma processing apparatus configured to manufacture the MRAM device 100.

A plasma processing apparatus 10 includes a processing chamber 12. The processing chamber 12 has a substantially cylindrical shape and partitions a processing space S as an inner space thereof. The plasma processing apparatus 10 includes a substantially circular plate-shaped base 14 within the processing chamber 12. The base 14 is provided at a lower space of the processing space S. The base 14 is made of, for example, aluminum and serves as a second electrode. The base 14 is configured to cool an electrostatic chuck 50 to be described later by absorbing heat from the electrostatic chuck 50.

Within the base 14, a coolant path 15 is formed, and the coolant path 15 is connected to a coolant inlet line and a coolant outlet line. By appropriately circulating a coolant such as cooling water through the coolant path 15, the base 14 and the electrostatic chuck 50 are controlled to have a preset temperature.

In the example embodiment, the plasma processing apparatus 10 further includes a cylindrical holder 16 and a cylindrical supporting unit 17. The cylindrical holder 16 is in contact with a periphery of a side surface and a bottom surface of the base 14 to hold the base 14. The cylindrical supporting unit 17 is vertically extended from a bottom portion of the processing chamber 12 and is configured to support the base 14 via the cylindrical holder 16. The plasma processing apparatus 10 further includes a focus ring 18 mounted on a top surface of the cylindrical holder 16. The focus ring 18 may be made of, for example, silicon or quartz.

In the example embodiment, between a side wall of the processing chamber 12 and the cylindrical supporting unit 17, an exhaust path 20 is formed. A baffle plate 22 is provided at an inlet or at the middle of the exhaust path 20. Further, an exhaust opening 24 is formed at a bottom portion of the exhaust path 20. An exhaust pipe 28 is inserted and fitted into a bottom portion of the processing chamber 12 to form the exhaust opening 24. The exhaust pipe 28 is connected to an exhaust device (exhaust unit) 26. The exhaust device 26 includes a vacuum pump and can depressurize the processing space S within the processing chamber 12 to a certain vacuum level. At a side wall of the processing chamber 12, a gate valve 30 configured to open and close a loading/unloading opening of the target object (substrate) W is provided.

The base 14 is electrically connected to a second high frequency power supply (second power supply unit) 32 for plasma generation via a matching unit 34. The second high frequency power supply 32 is configured to apply a high frequency power having a second frequency (for example, about 400 kHz) to the second electrode, i.e., the base 14.

The plasma processing apparatus 10 further includes a shower head 38 therein. The shower head 38 is provided at an upper space of the processing space S. The shower head 38 includes an electrode plate 40 and an electrode supporting member 42.

The electrode plate 40 is a conductive plate having a substantially circular plate shape and serves as a first electrode. The electrode plate 40 is electrically connected to a first high frequency power supply (first power supply unit) 35 for plasma generation via a matching unit 36. The first high frequency power supply 35 is configured to apply a high frequency power having a first frequency (for example, about 60 MHz) to the electrode plate 40. If high frequency powers are applied to the base 14 and the electrode plate 40 from the second high frequency power supply 32 and the first high frequency power supply 35, respectively, a high frequency electric field is formed at a space, i.e., the processing space S, between the base 14 and the electrode plate 40.

Multiple gas through holes 40h are formed in the electrode plate 40. The electrode plate 40 is detachably attached and supported on the electrode supporting member 42. Within the electrode supporting member 42, a buffer room 42a is formed. The plasma processing apparatus 10 further includes a gas supply unit 44, and a gas inlet opening 25 of the buffer room 42a is connected to the gas supply unit 44 via a gas supply line 46. The gas supply unit 44 is configured to supply a processing gas into the processing space S. By way of example, the gas supply unit 44 can supply several kinds of etching gases. The electrode supporting member 42 includes multiple holes respectively connected to the multiple gas through holes 40h, and the multiple holes communicate with the buffer room 42a. Therefore, a gas supplied from the gas supply unit 44 is supplied into the processing chamber S through the buffer room 42a and the gas through holes 40h. Further, in order to control a distribution of radicals, a flow rate ($F_C$) of the processing gas at a central portion of the target object W and a flow rate ($F_E$) of the processing gas at a peripheral portion of the target object W may be controlled.

In the example embodiment, at a ceiling of the processing chamber 12, there is provided a magnetic field forming unit 48 that is extended annularly or concentrically. The magnetic field forming unit 48 is configured to facilitate the start of the high frequency electric discharge (plasma ignition) in the processing space S and stably maintain the electric discharge.

In the example embodiment, the electrostatic chuck 50 is mounted on a top surface of the base 14. The electrostatic chuck 50 includes an electrode 52 and a pair of insulating films 54a and 54b. The insulating films 54a and 54b are made of an insulating material such as ceramic. The electrode 52 is a conductive film and provided between the insulating films 54a and 54b. Further, the electrode 52 is connected to a DC power supply 56 via a switch SW. If a DC voltage is applied to the electrode 52 from the DC power supply 56, a Coulomb force is generated, and the target object W is attracted and held onto the electrostatic chuck 50 by the Coulomb force. Within the electrostatic chuck 50, a heater as a heating member is embedded and configured to heat the target object W to a certain temperature. The heater is connected to a heater power supply (not illustrated) via a wiring. The base 14 and the electrostatic chuck 50 serve as a mounting table 70.

In the example embodiment, the plasma processing apparatus 10 further includes gas supply lines 58 and 60 and heat transfer gas supplying units 62 and 64. The heat transfer gas supplying unit 62 is connected to the gas supply line 58. The gas supply line 58 is extended to a top surface of the electrostatic chuck 50 and extended annularly at a central portion of the top surface thereof. The heat transfer gas supplying unit 62 is configured to supply a heat transfer gas such as a He gas between the top surface of the electrostatic chuck 50 and the target object W. Further, the heat transfer gas supplying unit 64 is connected to the gas supply line 60. The gas supply line 60 is extended to the top surface of the electrostatic chuck 50 and extended annularly at the top surface thereof to surround the gas supply line 58. The heat transfer gas supplying unit 64 is configured to supply a heat transfer gas such as a He gas between the top surface of the electrostatic chuck 50 and the target object W.

In the example embodiment, the plasma processing apparatus 10 further includes a control unit 66. The control unit 66 is connected to the exhaust device 26, the switch SW, the second high frequency power supply 32, the matching unit 34, the first high frequency power supply 35, the matching unit 36, the gas supply unit 44, and the heat transfer gas supplying units 62 and 64. The control unit 66 transmits a control signal to each of the exhaust device 26, the switch SW, the second high frequency power supply 32, the matching unit 34, the first high frequency power supply 35, the matching unit 36, the gas supply unit 44, and the heat transfer gas supplying units 62 and 64. In response to the control signal from the control unit 66, exhaust by the exhaust device 26, ON/OFF of the switch SW, power supply from the second high frequency power supply 32, impedance control of the matching unit 34, power supply from the first high frequency power supply 35, impedance control of the matching unit 36, processing gas supply by the gas supply unit 44, and heat transfer gas supply by each of the heat transfer gas supplying units 62 and 64 are controlled.

In the plasma processing apparatus 10, a processing gas is supplied from the gas supply unit 44 to the processing space S. Further, a high frequency electric field is formed between the electrode plate 40 and the base 14, i.e. in the processing space S. Thus, plasma is generated in the processing space S, and the target object W is etched with radicals of the element contained in the processing gas.

Figure 4:
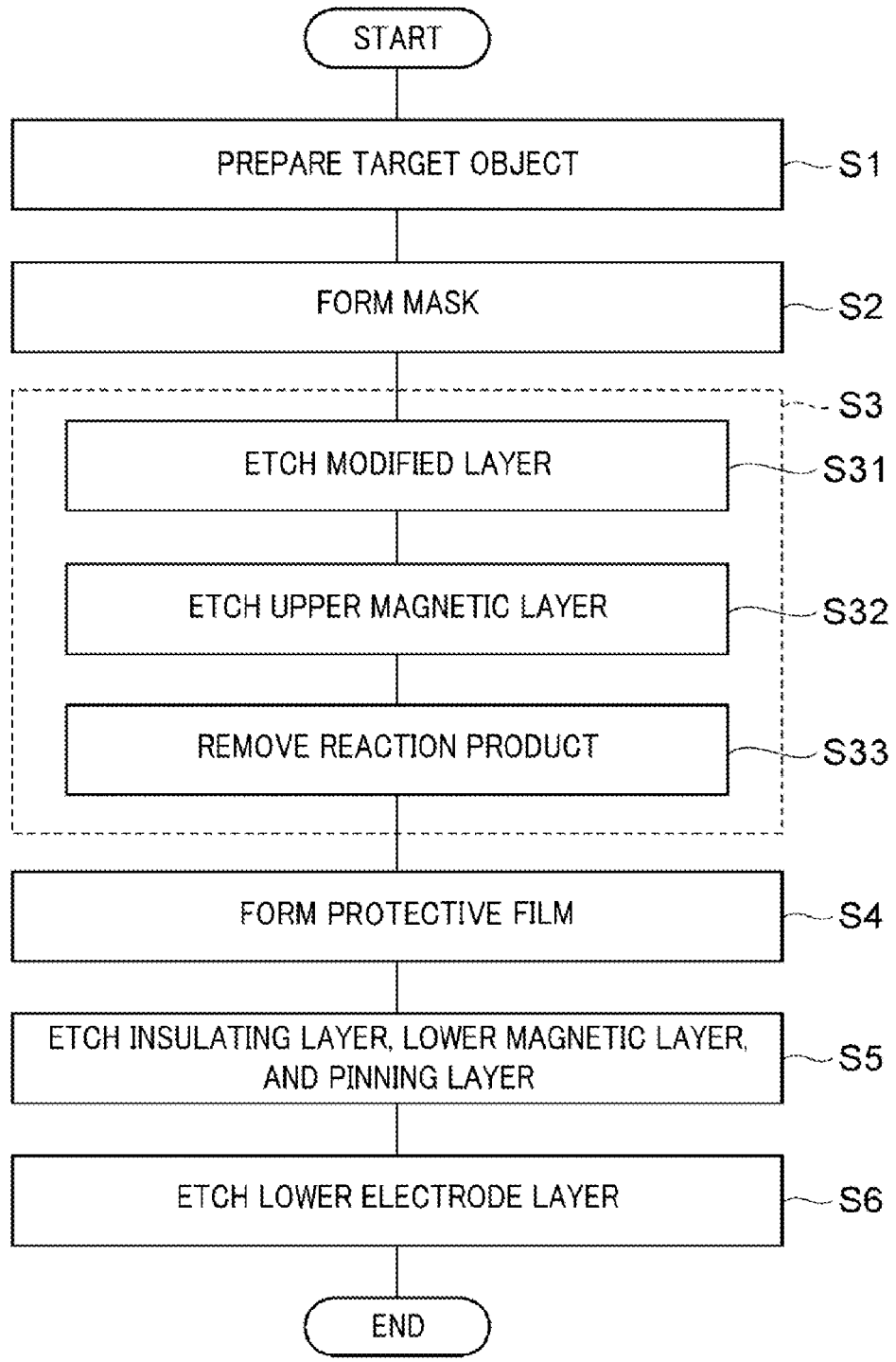
FIG. 4 is a flow chart showing the plasma processing method in accordance with the example embodiment.
Figure 5:
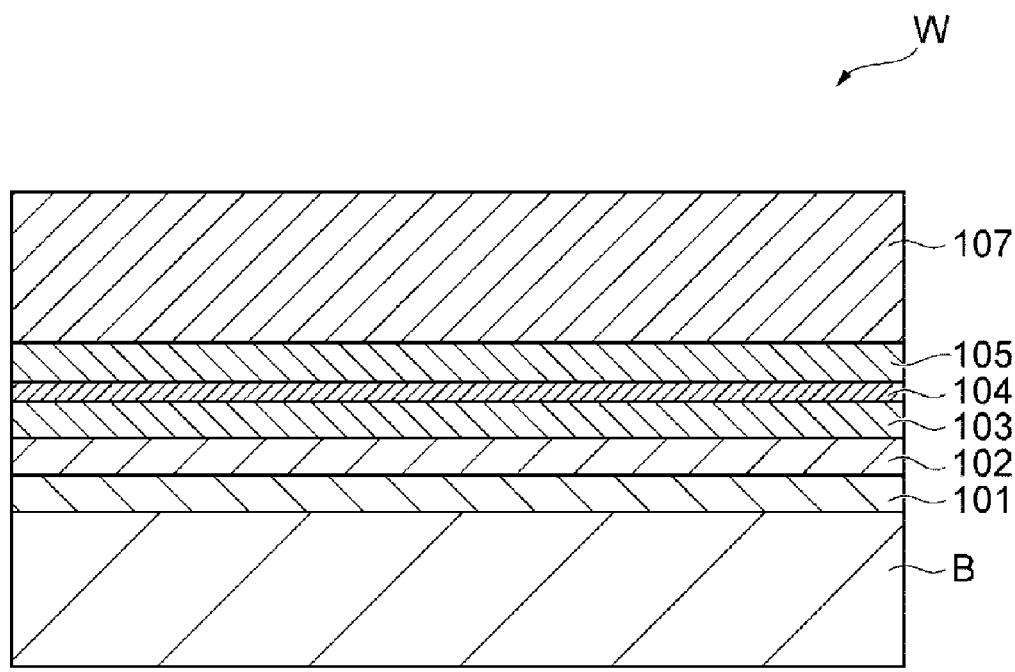
FIG. 5 illustrates a process of manufacturing the MRAM device using the plasma processing method in accordance with the example embodiment.

Hereinafter, there will be explained a plasma processing method performed in the plasma processing apparatus 10 described above. FIG. 4 is a flow chart showing a plasma processing method in accordance with the example embodiment. In the plasma processing method, as depicted in FIG. 4, at block 51 (Prepare Target Object), the target object W is prepared and the target object W is mounted on the electrostatic chuck 50 in the processing chamber 12. FIG. 5 illustrates an example of the target object W formed during the manufacturing process of the MRAM device 100. The target object W is a multilayered material which is stacked on the substrate B in a film forming apparatus employed as the process module PM2. The multilayered material has a structure in which the lower electrode layer 101, the pinning layer 102, the first magnetic layer 103, the insulating layer 104, the second magnetic layer 105, and the mask material 107 are stacked in sequence on the substrate B. Hereinafter, there will be explained the plasma processing method in accordance with the example embodiment with reference to the target object W depicted in FIG. 5. Processing may proceed from block S1 to block S2.

Figure 6:
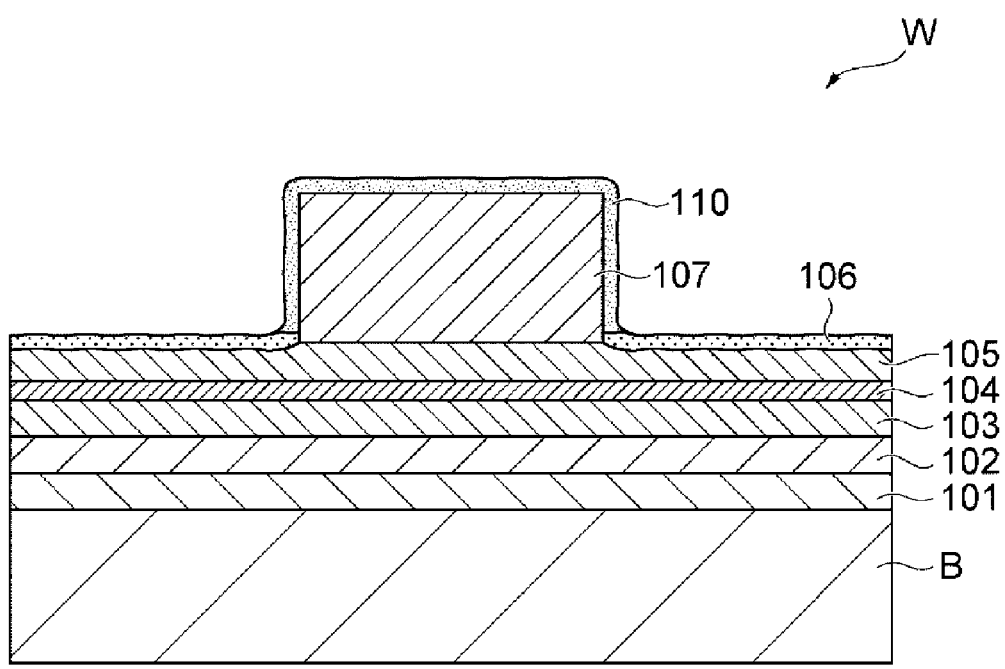
FIG. 6 illustrates a process of manufacturing the MRAM device using the plasma processing method in accordance with the example embodiment.

At block S2 (Form Mask) (Mask Forming Process), the mask material 107 is etched. An etching gas used at this time may be any gas, but may include, for example, but not limitation, $BCl_3$, $Cl_2$, $CF_4$, $NF_3$, $CH_4$ or $SF_6$. Further, as a mask for etching the mask material 107, for example, carbon may be used. During the etching process, as depicted in FIG. 6, a surface of the second magnetic layer 105 exposed by the etching is combined with a reaction product of a metal contained in the mask material 107, and then, modified to form a modified layer 106. Otherwise, an etching residue is deposited on the surface of the second magnetic layer 105 exposed by the etching, and then, the modified layer 106 is formed. Still otherwise, when the second magnetic layer 105 and the mask material 107 are formed, the surface of the second magnetic layer 105 is modified to form the modified layer 106. Therefore, the modified layer 106 contains at least the metal element contained in the mask material 107. By way of example, the modified layer 106 contains Ta. Further, the modified layer 106 may contain an element of the second magnetic layer 105. That is, the modified layer 106 may contain Co, Fe, and O. Furthermore, during the mask forming process, a surface of the mask material 107 may be modified to form a modified mask layer 110. Processing may proceed from block S2 to block S31.

Figure 7:
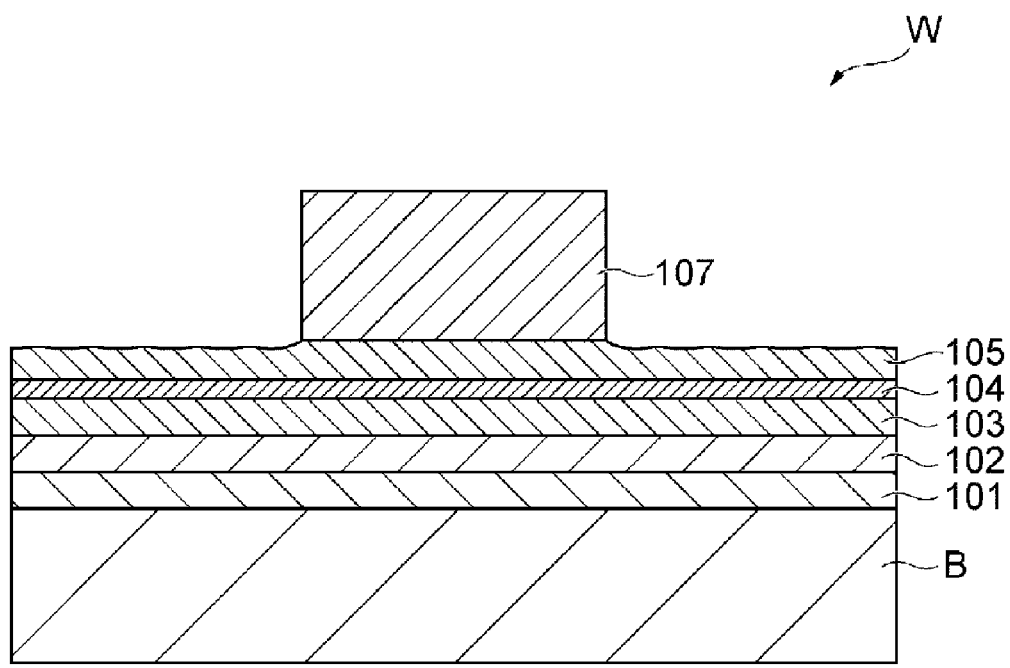
FIG. 7 illustrates a process of manufacturing the MRAM device using the plasma processing method in accordance with the example embodiment.

Therefore, at block S31 (Etch Modified Layer) (First Etching Process), the modified layer 106 secondarily formed during the mask forming process is removed. A first processing gas containing fluorine (F) or a fluorine compound ($NF_3$ or $SF_6$) is supplied from the gas supply unit 44 into the processing chamber 12 and plasma is generated to etch the target object W. Since the modified layer 106 contains the metal element, it can be etched by using F radicals. By way of example, if the mask material 107 contains Ta, the modified layer 106 contains Ta. Therefore, by allowing the F radicals to react with the modified layer 106, TaF is formed. Then, by evaporating and exhausting this TaF, the modified layer 106 can be removed. Although the modified layer 106 containing Ta can be etched by using chlorine ($Cl_2$), since TaF has a lower saturated vapor pressure than $TaCl_2$, fluorine (F) or a fluorine compound is effective as the first processing gas. The first processing gas may include an inert gas such as He, $N_2$, Ar, or the like, and $H_2$. As depicted in FIG. 7, at block S31, the modified layer 106 is etched with the first processing gas. Processing may proceed from block S31 to block S32.

Then, at block S32 (Etch Upper Magnetic Layer) (Second Etching Process), the second magnetic layer 105 as an upper magnetic layer is etched. A second processing gas containing a halogen element is supplied from the gas supply unit 44 into the processing chamber 12 and plasma is generated to etch the target object W. As the halogen element, fluorine (F) or chlorine ($Cl_2$) is used. Further, the second processing gas may include an inert gas such as He, $N_2$, Ar, or the like, and $H_2$. At block S32, by using the second processing gas, a part of the second magnetic layer 105 that is not covered with the etching mask 107 reacts with the halogen element such as fluorine (F) to be etched. However, since MgO does not react with the halogen element, the insulating layer 104 is not etched. Therefore, at block S32, the etching process is ended on the surface of the insulting layer 104.

At block S32, when the second magnetic layer 105 is etched with the second processing gas, an etching target material reacts with the second processing gas to produce a byproduct. The byproduct is produced by a reaction between CoFeB of the second magnetic layer 105 and fluorine (F) or chlorine ($Cl_2$) contained in the second processing gas. The byproduct may be, for example, $CoCl_2$ and CoF.

Figure 8:
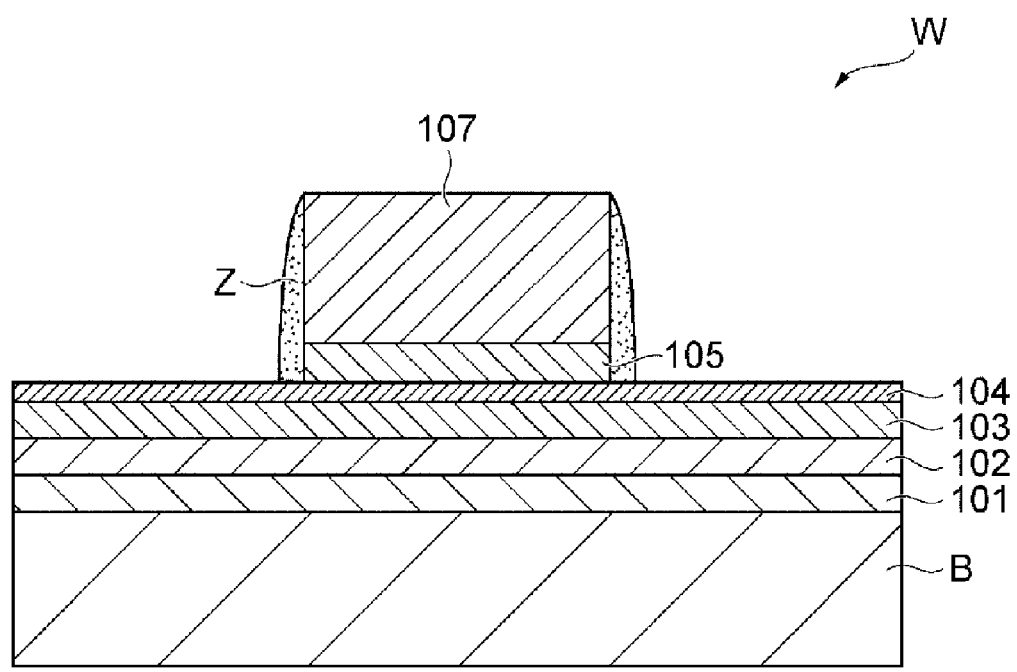
FIG. 8 illustrates a process of manufacturing the MRAM device using the plasma processing method in accordance with the example embodiment.

As depicted in FIG. 8, the byproduct is deposited as a residue Z on side walls of the second magnetic layer 105 and the etching mask 107. Since the residue Z contains a conductive material, it may cause generation of a leak current at the MRAM device. Processing may proceed from block S32 to block S33.

At block S33 (Remove Reaction Product) (Third Etching Process), a third processing gas containing hydrogen ($H_2$) is supplied from the gas supply unit 44 into the processing chamber 12 and plasma is generated to remove the residue Z produced at block S32. The third processing gas may include an inert gas such as He, $N_2$, Ar, or the like.

At block S33, as expressed by formula (1) or formula (2), a reaction between $CoCl_2$, CoF, or the like of the residue Z and $H_2$ contained in the third processing gas is carried out in the processing chamber 12.

$$CoCl_2 + H_2 \rightarrow 2HCl + Co \qquad (1)$$

$$2CoF + H_2 \rightarrow 2HF + 2Co \qquad (2)$$

Figure 9:
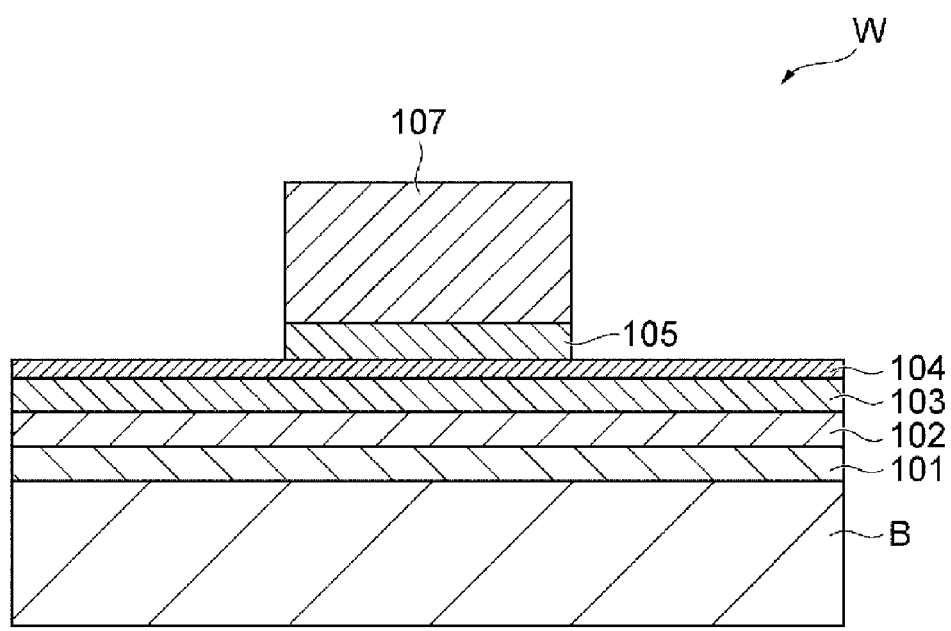
FIG. 9 illustrates a process of manufacturing the MRAM device using the plasma processing method in accordance with the example embodiment.

At block S33, as shown in formula (1) or formula (2), $CoCl_2$, CoF, or the like of the residue Z reacts with $H_2$ contained in the third processing gas to produce HCl and Co, or HF and Co. Among the products of block S33, HCl or HF is volatilized to be discharged to the outside. Further, Co produced at block S33 has a porous shape and is sputtered by, for example, $N_2$ or Ar to be separated and removed. Further, Fe can also be removed in the same manner as described above. At block S33, as depicted in FIG. 9, the residue Z is removed from the side walls of the second magnetic layer 105 and the etching mask 107. Processing may proceed from block S33 to block S4.

Blocks S31 to S33 can be carried out at the same time. By way of example, the first processing gas and the second processing gas may be mixed to carry out block S31 and block S32 at the same time. Further, it is possible to allow the first processing gas to have the same elements as the second processing gas. Moreover, the second processing gas and the third processing gas may be mixed to carry out block S32 and block S33 at the same time. By way of example, the first processing gas, the second processing gas, and the third processing gas may be mixed to carry out blocks S31 to S33 at the same time as block S3.

Hereinafter, there will be explained an example of processing conditions when block S3 is carried out in the plasma processing apparatus 10.

Figure 10:
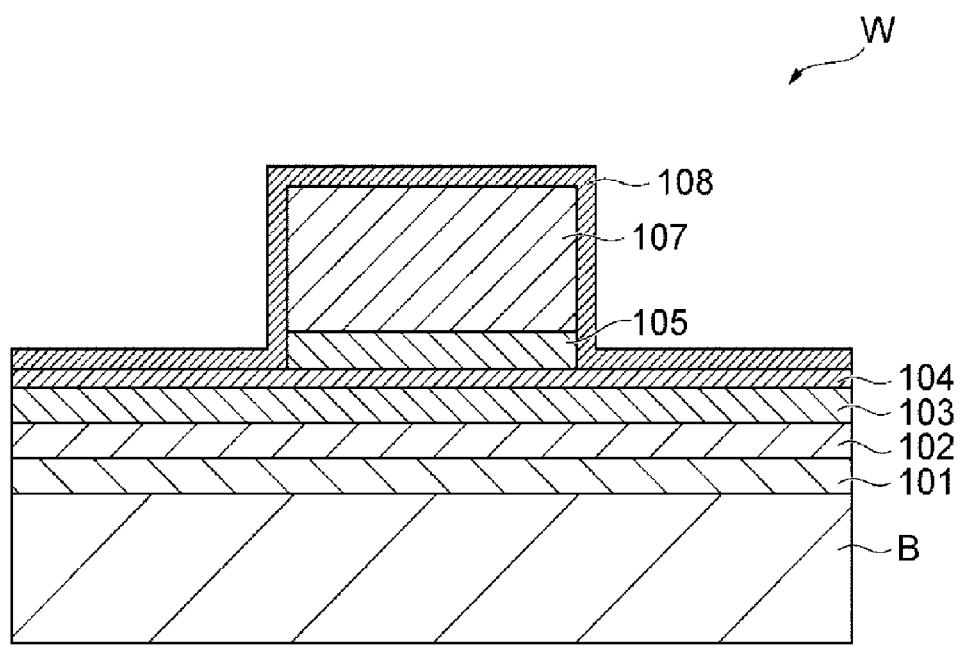
FIG. 10 illustrates a process of manufacturing the MRAM device using the plasma processing method in accordance with the example embodiment.

(Block S3)
Pressure in processing space S: about 10 mTorr (about 1.33 Pa)
Power from first high frequency power supply 35: about 500 W
Power from second high frequency power supply 32: about 500 W
Flow rates of first processing gas, second processing gas, and third processing gas:
$NF_3$ gas: about 10 sccm
$H_2$ gas: about 300 sccm
Ar gas: about 100 sccm
Radical distribution control (RDC) $F_C/F_E$: about 50
Process time: about 30 to about 40 seconds In the plasma processing method in accordance with the example embodiment, at block S4 (Form Protective Film) (Coating Process), as depicted in FIG. 10, a surface of the target object W is covered with the insulating film 108 serving as a protective film. By way of example, the target object W is transferred to a film forming apparatus (for example, RLSA apparatus or CVD apparatus) employed as the process module PM2 depicted in FIG. 2 to form the insulating film 108. By way of example, as the insulating film 108, SiN or $SiO_2$ is used. Then, the target object W is returned back to the plasma processing apparatus 10 depicted in FIG. 3, and the insulating film 108 is etched so that the insulating film 108 remains at the side walls of the second magnetic layer 105 and the etching mask 107. Processing may proceed from block S4 to block S5.

Figure 11:
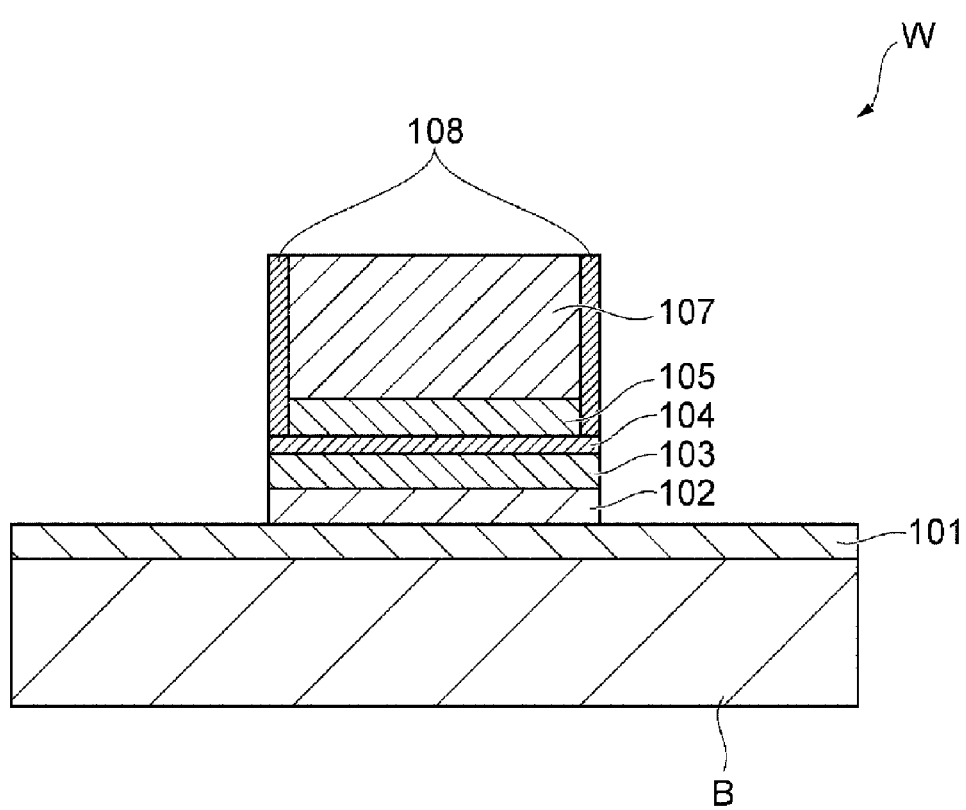
FIG. 11 illustrates a process of manufacturing the MRAM device using the plasma processing method in accordance with the example embodiment.

In the plasma processing method in accordance with the example embodiment, at block S5 (Etch Insulating Layer, Lower Magnetic Layer, and Pinning Layer) (Fourth Etching Process), a fourth processing gas containing methane ($CH_4$) is supplied from the gas supply unit 44 into the processing chamber 12 and plasma is generated to etch the insulting layer 104 and the first magnetic layer 103. Further, the pinning layer 102 may be etched together. The target object W etched at block S5 is illustrated in FIG. 11. The fourth processing gas may include an inert gas such as He, $N_2$, Ar, or the like, or a gas containing a carbonyl group, $H_2$ or the like except methane. At block S5, parts of the insulating layer 104, the first magnetic layer 103, and the pinning layer 102 that are not covered with the etching mask 107 and the insulating film 108 are etched with the fourth processing gas. At this time, a metal contained in the etching target films becomes an organic metal to be volatilized and exhausted. Thus, the pinning layer 102, the first magnetic layer 103, and the insulating layer 104 are etched to have a width greater than that of the second magnetic layer 105 and the etching mask 107 by a width of the insulating film 108 formed at the side walls of the second magnetic layer 105 and the etching mask 107. Processing may proceed from block S5 to block S6.

Figure 12:
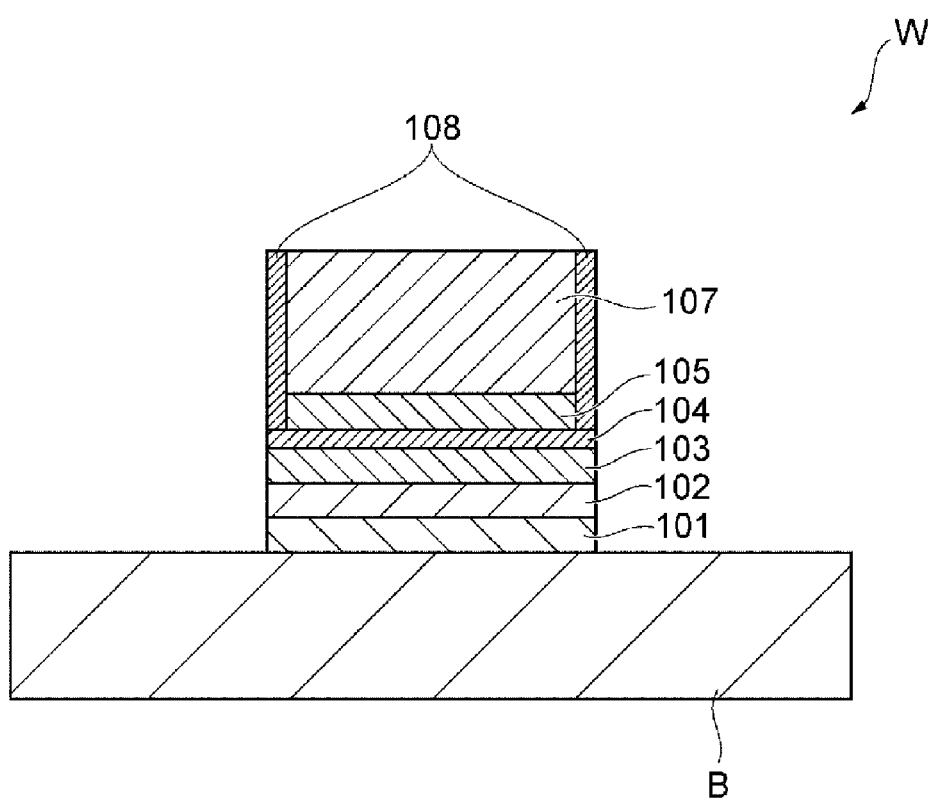
FIG. 12 illustrates a process of manufacturing the MRAM device using the plasma processing method in accordance with the example embodiment.

In the plasma processing method in accordance with the example embodiment, at block S6 (Etch Lower Electrode Layer), a fifth processing gas is supplied from the gas supply unit 44 into the processing chamber 12 and plasma is generated to etch the lower electrode layer 101. The target object W etched at block S6 is illustrated in FIG. 12. As the fifth processing gas, the same gas as the fourth processing gas may be used. That is, the fifth processing gas may include an inert gas such as He, $N_2$, Ar, or the like or a gas containing a carbonyl group, a gas such as $CH_4$, $H_2$ or the like. At block S6, a part of the lower electrode layer 101 that is not covered with the etching mask 107 and the insulating film 108 is etched with the fifth processing gas. At this time, a metal contained in the etching target film becomes an organic metal to be volatilized and exhausted. Thus, the lower electrode layer 101 is etched to have a width greater than that of the second magnetic layer 105 and the etching mask 107 by the width of the insulating film 108 formed at the side walls of the second magnetic layer 105 and the etching mask 107.

When block S6 is ended, the plasma process depicted in FIG. 4 is ended. In this way, a MRAM device is formed in a desired shape from a target object W having a multilayered structure. Hereinafter, processing conditions when the plasma processing method is carried out in the plasma processing apparatus 10 will be explained in detail.

In the plasma processing method in accordance with the example embodiment, during the etching processes at blocks S2, S3, S5, and S6, a power having a frequency of about 1 MHz or less as a second high frequency may be applied from the second high frequency power supply 32 to the second electrode. In particular, a power having a frequency of about 400 kHz or less as a second high frequency may be applied from the second high frequency power supply 32 to the base 14. If a power having a relatively low frequency is applied from the second high frequency power supply 32 to the base 14, plasma is generated at the relatively upper space of processing space S, i.e. a position apart from the target object W as compared to a case of applying a power having a relatively high frequency. Thus, a cathode drop voltage Vdc is increased, and an ion can be vertically attracted by the second electrode. As a result, verticality of etching profile is improved. Further, since plasma is not generated right above the target object W, it is possible to suppress dissociation of an organic metal complex separated from the target object W at blocks S5 and S6.

In the plasma processing method in accordance with the example embodiment, during the etching processes at blocks S2, S3, S5, and S6, particularly, at blocks S5 and S6, the first high frequency power supply 35 may apply a power of about 100 W to about 300 W to the electrode plate 40 to generate plasma at a low dissociation region in the processing chamber 12. Thus, the first magnetic layer 103 containing CoFeB can be plasma-etched to be discharged in the form of an organic metal complex having a large molecular structure.

In the plasma processing method in accordance with the example embodiment, during the etching processes at blocks S2, S3, S5, and S6, a pressure inside the processing space S may be set to about 10 mTorr to about 30 mTorr (about 1.33 Pa to about 4.00 Pa). By setting the pressure inside the processing space S to be about 30 mTorr (about 4.00 Pa) or less, a density of plasma generated in the processing space S can be reduced, and by lengthening an ion mean free path, verticality of etching profile can be improved. Meanwhile, by setting the pressure inside the processing space S to be about 10 mTorr (about 1.33 Pa) or more, appropriate etching selectivity between the insulating film 108 and the insulating layer 104 can be obtained.

The plasma processing apparatus 10 configured to perform the plasma processing method in the example embodiment may have a gap of, for example, about 20 mm to about 30 mm. Herein, the gap refers to a height of the processing space S partitioned and formed by the processing chamber 12. In the plasma processing apparatus 10 having such a relatively low gap, a sputtering effect can be increased and exhaust can be promoted due to a low residence time.

According to the above-explained plasma processing method, the first processing gas containing fluorine or a fluorine compound is supplied during the first etching process and plasma is generated to etch the surface of the second magnetic layer 105 including the modified layer 106. F radicals react with Ta contained in the modified layer 106. For this reason, the modified layer 106, which contains Ta and is difficult to be etched, can be etched by using the fluorine or the fluorine compound. Further, the second processing gas containing a halogen element is supplied during the second etching process and plasma is generated to etch the second magnetic layer 105, and this etching process is ended on the surface of the insulating layer 104. If fluorine is used as the halogen element, F radicals react with CoFeB contained in the second magnetic layer 105, but do not react with MgO contained in the insulating layer 104. Thus, etching selectivity between the second magnetic layer 105 containing CoFeB and the insulating layer 104 containing MgO can be improved. As described above, it is also possible to etch the modified layer 106 and the second magnetic layer 105 at the same time by using the fluorine or the fluorine compound. Further, the fluorine or the fluorine compound can suppress a production amount of the residue Z which suppresses characteristics of a MRAM device as compared to chlorine. For this reason, it is possible to further improve the MRAM device characteristics by using the fluorine or the fluorine compound. Furthermore, according to the plasma processing method, the residue Z deposited on the side wall of the second magnetic layer 105 and the top surface of the insulating layer 104 can be removed by the etching gas using $H_2$ during the etching process. Thus, while improving verticality of the second magnetic layer 105, it is possible to avoid dispersion and deposition of the residue Z onto a side wall of the insulating layer 104 during the etching process of the insulating layer 104 to be described later. Therefore, according to the plasma processing method in accordance with the example embodiment, it is possible to suppress generation of a leak current and also possible to improve characteristics of MRAM device 100. Moreover, by using the processing gas including a mixture of fluorine or a fluorine compound and $H_2$, the residue Z can be removed at the same time while etching the modified layer 106 and the second magnetic layer 105. Therefore, it is possible to improve production efficiency.

Since the third processing gas further includes at least one of $N_2$, Ar, and He gases, it is possible to further remove the residue Z deposited on the side surface of the second magnetic layer 105 and the top surface of the insulating layer 104.

Moreover, since the plasma processing method further includes the coating process of coating the surface of the target object W with the insulating layer 108, in the post-process, it is possible to further suppress deposition of the residue Z on the side wall of the insulating layer 104.

Since the plasma processing method further includes, after the coating process, the fourth etching process of etching the insulating layer 104 and the first magnetic layer 103 by supplying the fourth processing gas containing $CH_4$ into the processing chamber 12 to generate plasma, a MRAM device can be formed from the target object W.

Further, the plasma processing apparatus 10 depicted in FIG. 3 includes the electrode plate 40 provided in the processing chamber 12, the base 14 provided to face the electrode plate 40, the first high frequency power supply 35 configured to apply a power of about 60 MHz to the electrode plate 40, and the second high frequency power supply 32 configured to apply a power of about 400 kHz to the base 14. Plasma is generated in the processing chamber 12 by applying the power having a frequency of about 400 kHz from the second high frequency power supply 32 to the base 14. In this case, since the power having a relatively low frequency is applied to the base 14, plasma is generated at a position apart from the target object W. Thus, an ion can be vertically attracted by the base 14, and verticality of a side wall of the target object W can be improved accordingly.

In the plasma processing method, a power of about 100 W to about 300 W is applied from the first high frequency power supply 35 to the electrode plate 40 to generate plasma in the processing chamber 12. Since the relatively low power is applied to the electrode plate 40, low-density plasma is generated at a lower limit of the margin of the plasma ignition, and for example, the etched insulating layer 104 or first magnetic layer 103 can be exhausted to the outside in the form of an organic metal complex having a large molecular structure.

In the plasma processing method, the plasma processing apparatus 10 further includes the exhaust device 26 configured to depressurize the processing chamber 12 to a desired pressure level and the control unit 66 configured to control the exhaust device 26. The control unit 66 controls the exhaust device 26 so that a pressure inside the processing space S is set to be about 10 mTorr to about 30 mTorr (about 1.33 Pa to about 4.00 Pa). Thus, by setting the pressure inside the processing space S to be low, a density of plasma generated in the processing space S can be reduced, and by lengthening an ion mean free path, verticality of etching profile can be improved.

In the plasma processing method, the processing space S has a gap of about 20 mm to about 30 mm. For this reason, a sputtering effect can be increased and exhaust can be promoted due to a low residence time (short staying time).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

By way of example, in the plasma processing apparatus 10 of the example embodiment, the electrode plate 40 is provided at an upper portion of the plasma processing apparatus 10, and the first high frequency power supply 35 applies the high frequency power from above the processing space S. However, the electrode plate 40 may be provided at a lower portion of the plasma processing apparatus 10, and the first high frequency power supply 35 may apply the high frequency power from below the processing space S.

Further, the MRAM device 100 of the example embodiment may include an upper electrode layer between the second magnetic layer 105 and the etching mask 107.

Experimental Example

Hereinafter, the present description will be explained in more detail based on experimental examples and comparative examples, but the present description is not limited to experimental examples below.

(Observation of Modified Layer 106)

The target object W depicted in FIG. 5 is etched with the first processing gas in the plasma processing apparatus 10 depicted in FIG. 3. The etching process is carried out under the following processing conditions.

(Etching Conditions)

Pressure in processing space S: about 150 mTorr (about 20 Pa)

Power from first high frequency power supply 35: about 100 W

Power from second high frequency power supply 32: about 200 W

Flow rate of first processing gas:

$SF_6$ gas: about 30 sccm

Ar gas: about 270 sccm

Radical distribution control (RDC) $F_C/F_E$: about 9

Process time: about 49 seconds (Target object W)

Etching mask 107: Ta

Second magnetic layer 105: CoFeB

Insulating layer 104: MgO

Figure 13:
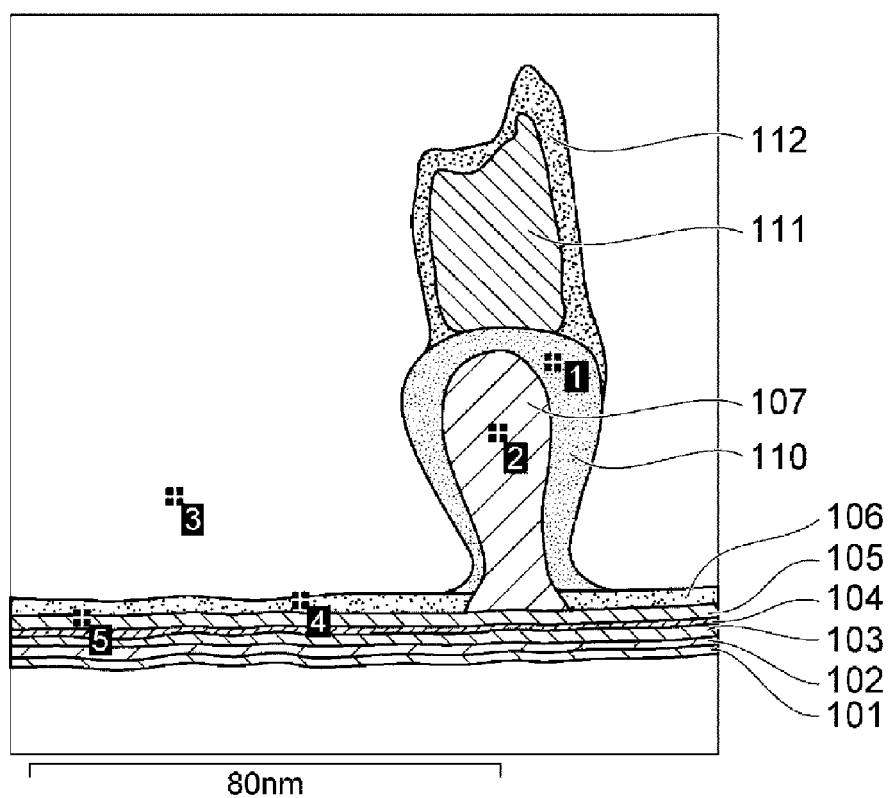
FIG. 13 is a schematic diagram of a TEM image of a target object.

Then, a cross section of the etched target object W is observed with a transmission electron microscope (TEM). A result thereof is as shown in FIG. 13. FIG. 13 is a schematic diagram of a TEM image. As depicted in FIG. 13, it is observed that the modified layer 106 is formed on a surface of the etched target object W. Further, a composition of each of multiple layers formed on the target object W is analyzed by energy-dispersive X-ray spectroscopy (EDX). Composition measurement points 1 to 5 are shown in FIG. 13, and a result of the EDX analysis is shown in FIG. 14. A composition measurement point 1 is positioned at a layer formed to cover the etching mask 107 and the composition thereof contains Ta and O. Thus, it is assumed as an oxide layer (modified mask layer 110) of the etching mask 107. A composition measurement point 2 is positioned at the etching mask 107 and the composition thereof contains Ta only. Thus, it is the etching mask 107. Further, a layer on the etching mask 107 is a mask 111 made of carbon, and a reference numeral 112 denotes a surface modification layer of the mask 111. A composition measurement point 3 is positioned at a burying material for TEM observation and the composition thereof contains Pt only. Thus, it is a burying material. A composition measurement point 5 is positioned at the second magnetic layer 105 and the composition thereof contains Co, Fe, Si, S, O, and Pt. It is assumed that since an underlying wafer contains the Si element, Si is mixed therein. Further, it is assumed that Pt as the burying material for TEM observation is mixed therein. It is assumed that S is obtained from $SF_6$ as a processing gas used for forming the etching mask 107. Therefore, since the composition measurement point 5 contains Co, Fe, and O as main components, it is the second magnetic layer 105. Herein, as depicted in FIG. 13, it is observed that only one layer is formed on the second magnetic layer 105. A composition measurement point 4 is positioned at the one layer formed on the second magnetic layer 105. From a result of the analysis of composition measurement point 4, it is clear that this layer contains Co, Fe, S, O, Pt, and Ta. It is assumed that Pt as the burying material for TEM observation is mixed therein. It is assumed that S is obtained from $SF_6$ as the processing gas used for forming the etching mask 107. Therefore, it is found out that the layer formed on the second magnetic layer 105 contains elements of the second magnetic layer 105 and a metal element of the etching mask 107. This shows that the one layer is the modified layer 106 in which the surface of the second magnetic layer 105 is modified, and the modified layer 106 is formed after the mask material is etched. Thus, it is found out that the modified layer 106 is formed on the second magnetic layer 105.

(Observation of Selectivity Between Second Magnetic Layer 105 and Insulating Layer 104)

With initial conditions as the etching mask 107 made of Ta, the second magnetic layer 105 made of CoFeB, the insulating layer 104 made of MgO, and the target object W in a state as depicted in FIG. 6, an etching process is carried out under the following conditions.

Experimental Example 1

Pressure in processing space S: about 10 mTorr (about 1.33 Pa)

Power from first high frequency power supply 35: about 500 W

Power from second high frequency power supply 32: about 500 W

Flow rates of first processing gas, second processing gas, and third processing gas:
NF$_3$ gas: about 10 sccm
H$_2$ gas: about 300 sccm
Ar gas: about 100 sccm
Radical distribution control (RDC) F$_C$/F$_E$: about 50
Process time: about 30 seconds or about 40 seconds Comparative Example 1

Flow rate of processing gas:
CH$_4$ gas: about 10 sccm
Ar gas: about 200 sccm
Process time: about 10 seconds
The other conditions are the same as those of the experimental example 1.

Comparative Example 2

After performing an etching process under the conditions of the comparative example 1, an ashing process is carried out.

Figure 15A:
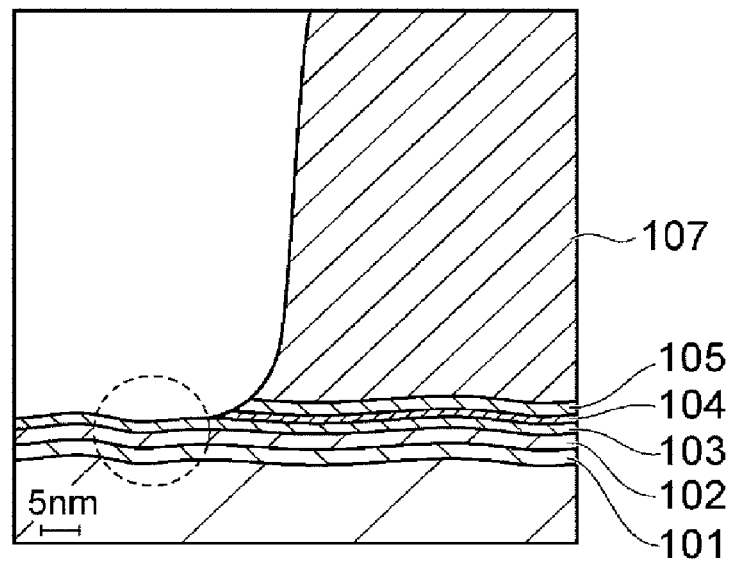
FIG. 15A and FIG. 15B provide schematic diagrams of TEM images of target objects obtained in comparative examples.
Figure 15B:
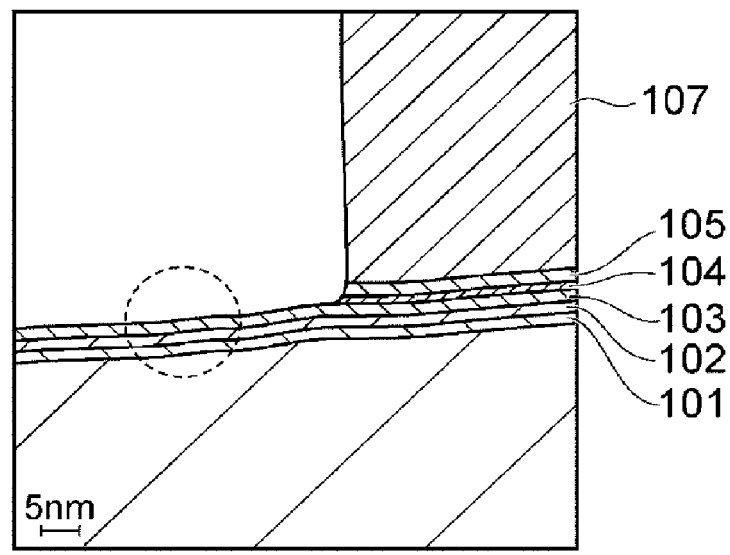

In the experimental example 1 and the comparative examples 1 and 2, a cross section of the etched or ashed target object W is observed with a transmission electron microscope. A schematic diagram of a cross sectional TEM image obtained in the comparative example 1 is shown in FIG. 15A, and a schematic diagram of a cross sectional TEM image obtained in the comparative example 2 is shown in FIG. 15B. Further, a schematic diagram of a cross sectional TEM image obtained in the experimental example 1 with a process time of about 30 seconds is shown in FIG. 16, and a schematic diagram of a cross sectional TEM image obtained in the experimental example 1 with a process time of about 40 seconds is shown in FIG. 17.

As depicted in FIG. 15A and FIG. 15B, when CH$_4$/Ar gases are used as a processing gas, both the second magnetic layer 105 and the insulating layer 104 are etched. As depicted in FIG. 15A and FIG. 15B, the insulating layer 104 made of MgO cannot be seen at areas circled in dotted lines. Therefore, it is found out that selectivity between the second magnetic layer 105 and the insulating layer 104 cannot be obtained.

Figure 16:
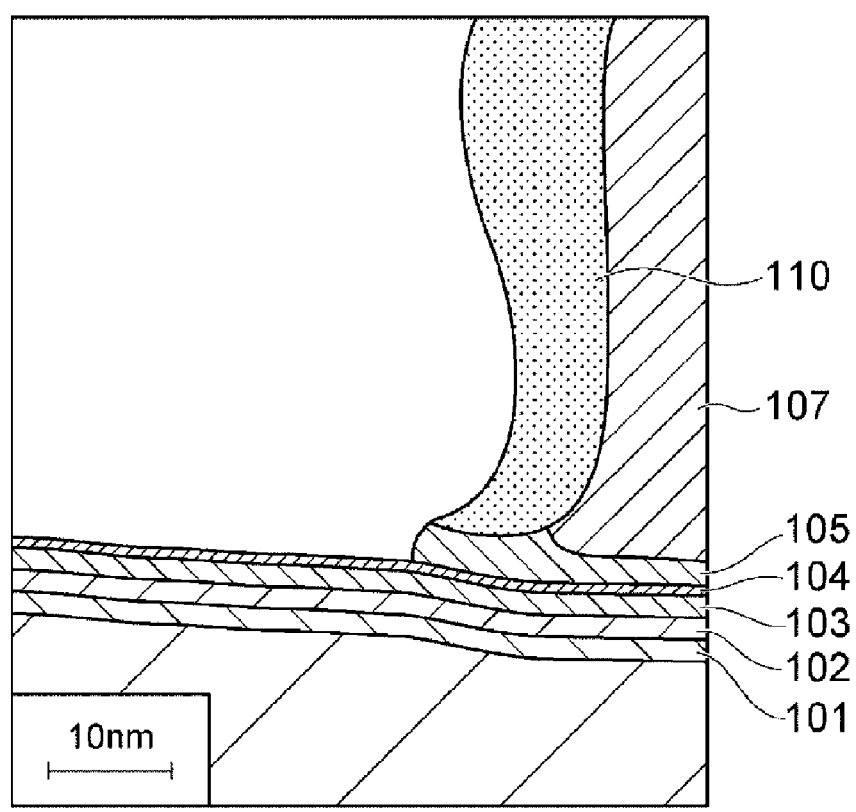
FIG. 16 is a schematic diagram of a TEM image of a target object obtained in an experimental example.
Figure 17:
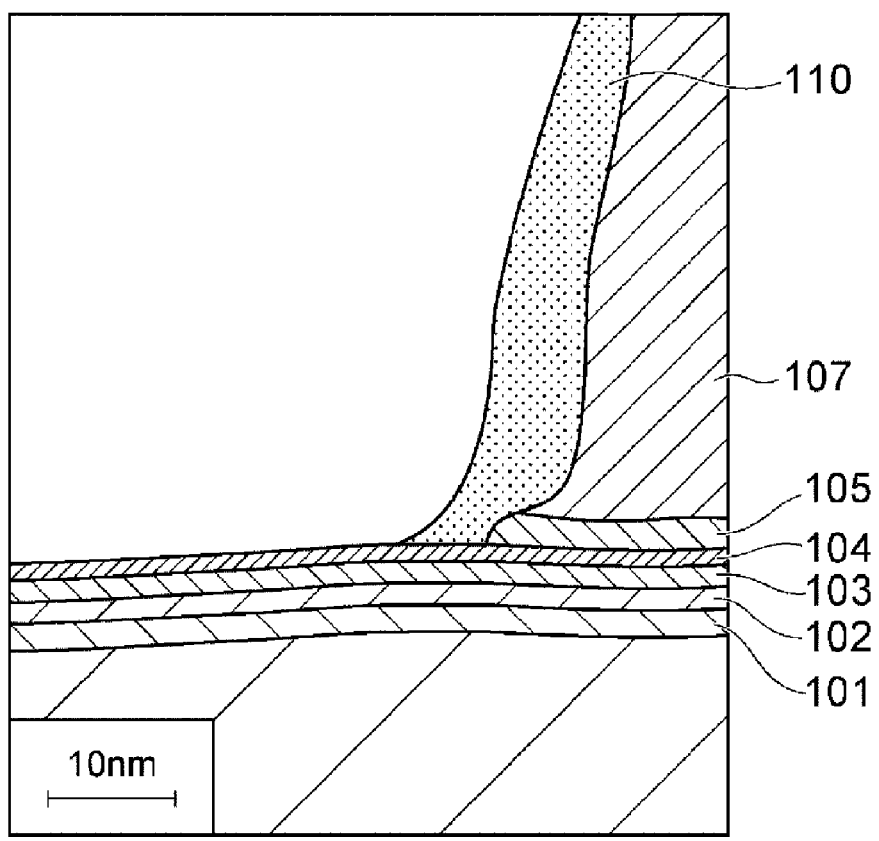
FIG. 17 is a schematic diagram of a TEM image of a target object obtained in an experimental example.

Meanwhile, as depicted in FIG. 16, in the case of the process time of about 30 seconds, it is observed that an etching process is stopped on the insulating layer 104. Further, as depicted in FIG. 17, even in the case of the process time of about 40 seconds, it is observed that the etching process is also stopped on the insulating layer 104. Thus, it is found out that an etching process can be ended on the top surface of the insulting layer 104 depending on a kind of a gas used in the experimental example 1.

(Observation of Residue Generation Suppressing Effect)

By comparing an etching process using fluorine to an etching process using chlorine, amounts of residues generated are observed.

Experimental Example 2

A process time is set to be about 30 seconds. The other conditions are the same as those of the experimental example 1.

Comparative Example 3

Power from first high frequency power supply 35: about 300 W

Power from second high frequency power supply 32: about 700 W
Processing gas:
BCl$_3$ gas: about 10 sccm
Ar gas: about 200 sccm
Process time: about 10 seconds
The other conditions are the same as those of the experimental example 2.

Figure 18A:
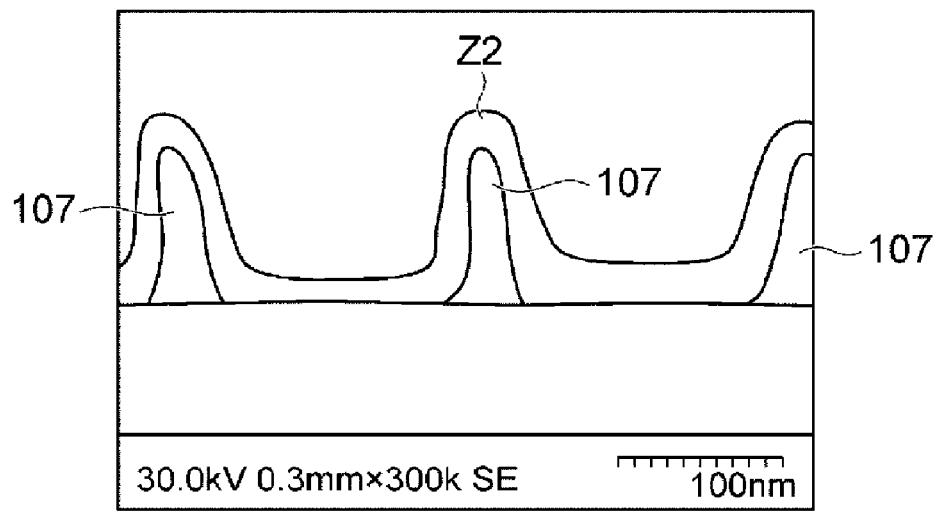
FIG. 18A and FIG. 18B provide schematic diagrams of SEM images of target objects obtained in comparative examples.
Figure 18B:
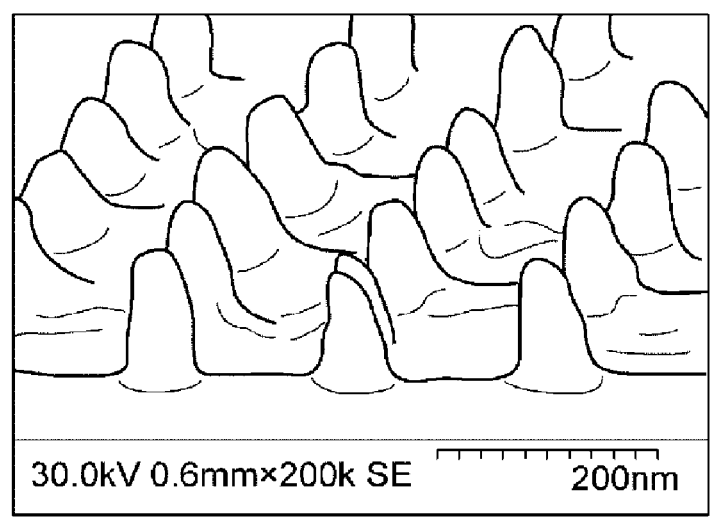

The experimental example 2 and the comparative example 3 are observed with a scanning electron microscope (SEM). A schematic diagram of a cross sectional SEM image obtained in the comparative example 3 is shown in FIG. 18A, and a schematic diagram of a perspective SEM image obtained in the comparative example 3 is shown in FIG. 18B. Further, a schematic diagram of a cross sectional SEM image obtained in the experimental example 2 is shown in FIG. 19A, and a schematic diagram of a perspective SEM image obtained in the experimental example 2 is shown in FIG. 19B.

As depicted in FIG. 18A and FIG. 18B, when BCl$_3$ is used as a processing gas, it is observed that a residue Z2 covering the etching mask 107 and a gap between the etching masks 107 is generated. It is assumed that the residue Z2 is generated because residual chloride is generated in a large amount from surplus Cl which is not consumed.

Figure 19A:
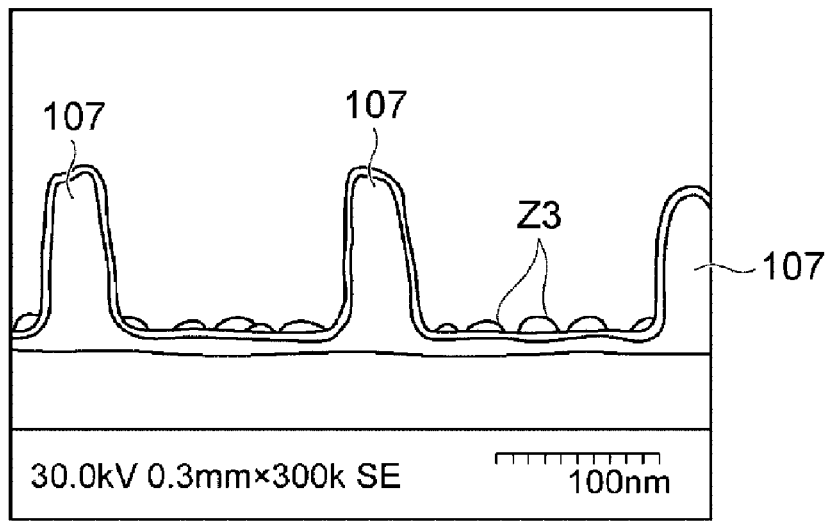
FIG. 19A and FIG. 19B provide schematic diagrams of SEM images of target objects obtained in experimental examples.
Figure 19B:
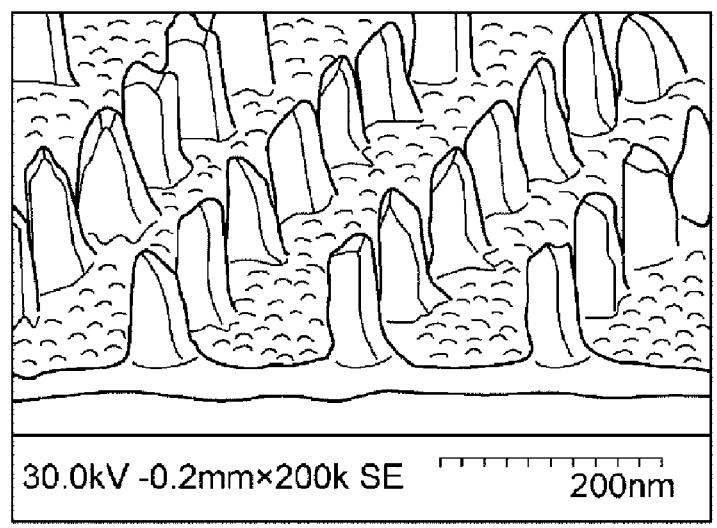

Meanwhile, as depicted in FIG. 19A and FIG. 19B, when NF$_3$ is used as a processing gas, it is observed that a residue Z3 covering the etching mask 107 and a gap between the etching masks 107 is formed in an amount smaller than a case using BCl$_3$. That is, it is found out that it is desirable to manufacture a MRAM device by using fluorine instead of chloride.

We claim:
1. A plasma processing method of etching a multilayered material that has a stacked structure, in which a first magnetic layer, an insulating layer, a second magnetic layer, and a mask material are stacked in sequence, in a plasma processing apparatus including a processing chamber that partitions a processing space where plasma is generated and a gas supply unit that supplies a processing gas into the processing space, the plasma processing method comprises:
    a mask forming process of forming a mask on the second magnetic layer by etching the mask material;
    an etching process of supplying the processing gas into the processing chamber to generate plasma; etching the second magnetic layer by using the mask; and stopping the etching on a surface of the insulating layer,
    wherein the second magnetic layer contains CoFeB,
    the insulating layer contains MgO, and
    the processing gas contains H$_2$ and F or a fluorine compound.
2. The plasma processing method of claim 1,
    wherein in the etching process, the second magnetic layer including a modified layer formed on a surface thereof is etched.
3. The plasma processing method of claim 2,
    wherein the modified layer contains a metal element contained in the mask material.
4. The plasma processing method of claim 3,
    wherein the metal element includes Ta.
5. The plasma processing method of claim 2,
    wherein the etching process comprises:
    a first etching process of supplying a first processing gas into the processing chamber to generate plasma; and etching the surface of the second magnetic layer including the modified layer;
    a second etching process of supplying a second processing gas into the processing chamber to generate plasma;

etching the second magnetic layer; and stopping the etching on the surface of the insulating layer; and a third etching process of supplying a third processing gas into the processing chamber to generate plasma; and removing a residue generated in the second etching process, wherein the first processing gas contains F or a fluorine compound, the second processing gas contains a gas having a halogen element, and the third processing gas contains $H_2$.

6. The plasma processing method of claim 5,
wherein the first processing gas and the second processing gas are supplied into the processing chamber at the same time, and the first etching process and the second etching process are carried out at the same time.

7. The plasma processing method of claim 5,
wherein the second processing gas and the third processing gas are supplied into the processing chamber at the same time, and the second etching process and the third etching process are carried out at the same time.

8. The plasma processing method of claim 5,
wherein the third processing gas further contains at least one of $N_2$, Ar, and He gases.

9. The plasma processing method of claim 5,
wherein the first processing gas and the second processing gas contain the same elements.

10. The plasma processing method of claim 1, further comprising:
a coating process of coating a surface of the multilayered material with an insulating film after the etching process.

11. The plasma processing method of claim 10, further comprising:
a fourth etching process of supplying a fourth processing gas into the processing chamber to generate plasma; and etching the insulating layer and the first magnetic layer after the coating process,
wherein the first magnetic layer contains CoFeB, and the fourth processing gas contains $CH_4$.

12. The plasma processing method of claim 1,
wherein the plasma processing apparatus further includes a first electrode provided in the processing chamber, a second electrode provided to face the first electrode, a first power supply unit configured to apply a power having a first frequency to the first electrode, and a second power supply unit configured to apply a power having a second frequency to the second electrode, and the second power supply unit applies a power having a frequency of about 1 MHz or less as the second frequency to the second electrode to generate plasma in the processing chamber.

13. The plasma processing method of claim 12,
wherein the second power supply unit applies a power having a frequency of about 400 kHz or less as the second frequency to the second electrode to generate plasma in the processing chamber.

14. The plasma processing method of claim 12,
wherein the first power supply unit applies a power of about 100 W to about 300 W to the first electrode to generate plasma in the processing chamber.

15. The plasma processing method of claim 1,
wherein the plasma processing apparatus further includes an exhaust unit configured to depressurize the processing space to a predetermined pressure level and a control unit configured to control the exhaust unit, and
the control unit controls the exhaust unit to allow a pressure in the processing space to be about 10 mTorr to about 30 mTorr.

16. The plasma processing method of claim 1,
wherein the processing space has a gap of about 20 mm to about 30 mm.

17. A plasma processing apparatus of etching a multilayered material having a stacked structure in which a first magnetic layer, an insulating layer, a second magnetic layer, and a mask material are stacked in sequence, the plasma processing apparatus comprising:
a processing chamber configured to partition a processing space where plasma is generated;
a gas supply unit configured to supply a processing gas into the processing space; and
a control unit configured to control the gas supply unit,
wherein the control unit controls the gas supply unit such that a mask is formed on the second magnetic layer by etching the mask material, and such that the processing gas is supplied into the processing chamber to generate plasma, the second magnetic layer is etched by using the mask, and the etching is stopped on a surface of the insulating layer,
the second magnetic layer contains CoFeB,
the insulating layer contains MgO, and
the processing gas contains $H_2$ and F or a fluorine compound.

* * * * *

UNITED STATES PATENT AND TRADEMARK OFFICE
CERTIFICATE OF CORRECTION

| | | |
|---|---|---|
| PATENT NO. | : 8,993,352 B2 | Page 1 of 1 |
| APPLICATION NO. | : 14/080214 | |
| DATED | : March 31, 2015 | |
| INVENTOR(S) | : Eiichi Nishimura | |

It is certified that error appears in the above-identified patent and that said Letters Patent is hereby corrected as shown below:

In the Specification,

Column 10, line 6, please replace "51" with -- S1 --

Signed and Sealed this
Eighteenth Day of August, 2015

Michelle K. Lee
*Director of the United States Patent and Trademark Office*